(12) United States Patent
Stengel et al.

(10) Patent No.: US 6,356,149 B1
(45) Date of Patent: Mar. 12, 2002

(54) TUNABLE INDUCTOR CIRCUIT, PHASE TUNING CIRCUIT AND APPLICATIONS THEREOF

(75) Inventors: Robert E. Stengel, Pompano Beach, FL (US); Wang-Chang Albert Gu, Scottsdale, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/546,618

(22) Filed: Apr. 10, 2000

(51) Int. Cl.$^7$ ................................................ H03F 3/68
(52) U.S. Cl. .................... 330/107; 330/124 R; 333/139
(58) Field of Search ............................. 330/107, 124 R; 333/139, 174, 175

(56) References Cited

U.S. PATENT DOCUMENTS

| | | | | |
|---|---|---|---|---|
| 3,906,409 A | * | 9/1975 | Whitehouse | 333/138 |
| 4,039,982 A | * | 8/1977 | Weldon | 334/45 |
| 4,961,062 A | * | 10/1990 | Wendler | 333/139 |
| 5,121,077 A | * | 6/1992 | McGann | 330/107 |
| 5,519,349 A | * | 5/1996 | Nakahara | 333/139 |
| 5,886,573 A | * | 3/1999 | Kolanek | 330/124 R |
| 5,886,591 A | * | 3/1999 | Jean et al. | 330/124 R |
| 6,147,555 A | * | 11/2000 | Posner et al. | 330/107 |

* cited by examiner

*Primary Examiner*—Robert Pascal
*Assistant Examiner*—Khanh V. Nguyen
(74) *Attorney, Agent, or Firm*—Andrew S. Fuller

(57) ABSTRACT

A tunable inductor circuit and phase tuning circuit utilizing a tunable inductor circuit for dynamically controlling signal phase delay in RF/Microwave Circuits and related applications. The tunable inductor includes an inductor and a voltage variable capacitor connected to each other. The tunable inductor and voltage variable capacitor can be connected to each other in parallel or in series. The phase tuning circuit includes at least one tunable inductor circuit and at least one voltage variable capacitor coupled to the at least one tunable inductor circuit, wherein the at least one tunable inductor circuit and the voltage variable capacitor are responsive to control signals to alter a tuning characteristic of the phase tuning circuit.

13 Claims, 5 Drawing Sheets

TUNABLE INDUCTOR CIRCUIT, PHASE TUNING CIRCUIT AND APPLICATIONS THEREOF

BACKGROUND OF THE INVENTION

1. Field of the Invention

The present invention generally relates to tunable inductor circuit and phase tuning circuit utilizing tunable inductor circuit for dynamically tuning signal phase in RF/Microwave circuits and related applications.

2. Description of the Related Art

RF and microwave circuits are widely used in a variety of applications including portable communication devices, such as wireless messaging devices and cellular phones. In many of these applications, power amplifiers are used in the radio receiver that require precise control of signal phase delay.

However, the performance of RF and microwave circuits is highly sensitive to small variations in the analog circuit parameters and to the environment in which they are operated. Small variations of the analog circuit parameters are inevitable as they result from internal defects due to manufacturing processes or from external conditions such as temperature and humidity variations in the operating environment. In a phase delay network, precise control of the signal phase delay is difficult due to the sensitivity of analog circuit parameters to these small variations. Additionally, analog circuits used in portable communication devices often lack a tuning circuit that is capable of compensating for the changing environment due to size and cost considerations.

Efforts have been made in the art to provide tunable devices and tuning circuits that can be implemented in RF and microwave circuits to limit the negative impact of the small variations in the circuit parameters and to improve the performance of these circuits. One improvement is to use a voltage variable capacitor in place of a fixed capacitor in a circuit. Because a voltage variable capacitor provides a range of different capacitance values, a circuit utilizing the voltage variable capacitor provides a tunable capacitive reactance to voltage signals that are applied to the circuit. However, the voltage variable capacitor itself has limited applications because it can only provide a tunable capacitive reactance.

A much wider range of applications can be realized if a suitable tunable inductor is available. Unfortunately, due to the nature of the magnetic fields, currently available tunable inductors are bulky, expensive, and especially impractical to be used in portable communication devices. Consequently, feasible dynamic control of the phase of a signal is not available in many RF and microwave circuits and related applications.

DETAILED DESCRIPTION OF THE INVENTION

Figure 1:
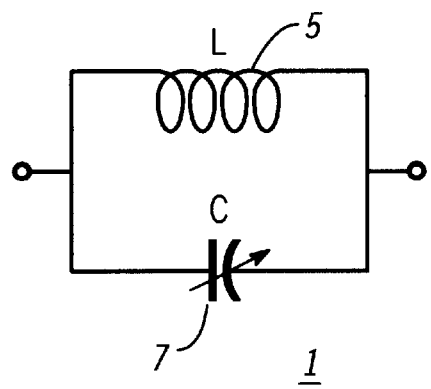
FIG. 1 is a first embodiment of a representative tunable inductor circuit according to the present invention.

Referring now to the drawings in which like numerals represent like components throughout the drawings. The present invention involves combining a voltage variable capacitor and an inductor together to effectively form a tunable inductor circuit that has a variable inductive reactance. The voltage variable capacitor and the inductor are connected to each other either in parallel or in series. This tunable inductor circuit can then be utilized to construct phase tuning circuits in a variety of forms and ways, which can be used in RF and microwave circuits and related applications including a lumped transmission line, a quadrature signal generator and a power amplifier to provide dynamic phase control and better performance.

Tunable Inductor Circuit

Figure 2:
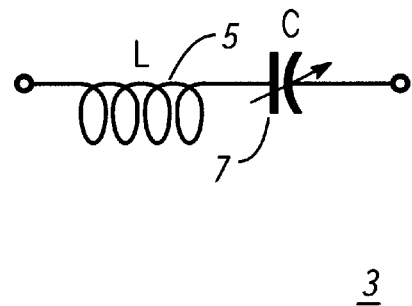
FIG. 2 is a second embodiment of a representative tunable inductor circuit according to the present invention.
Figure 3:
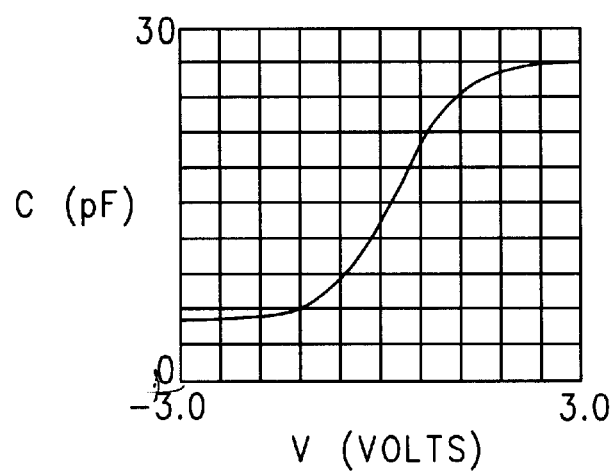
FIG. 3 shows a tuning range of a representative voltage variable capacitor used in the embodiments as shown in FIGS. 1 and 2.
Figure 4:
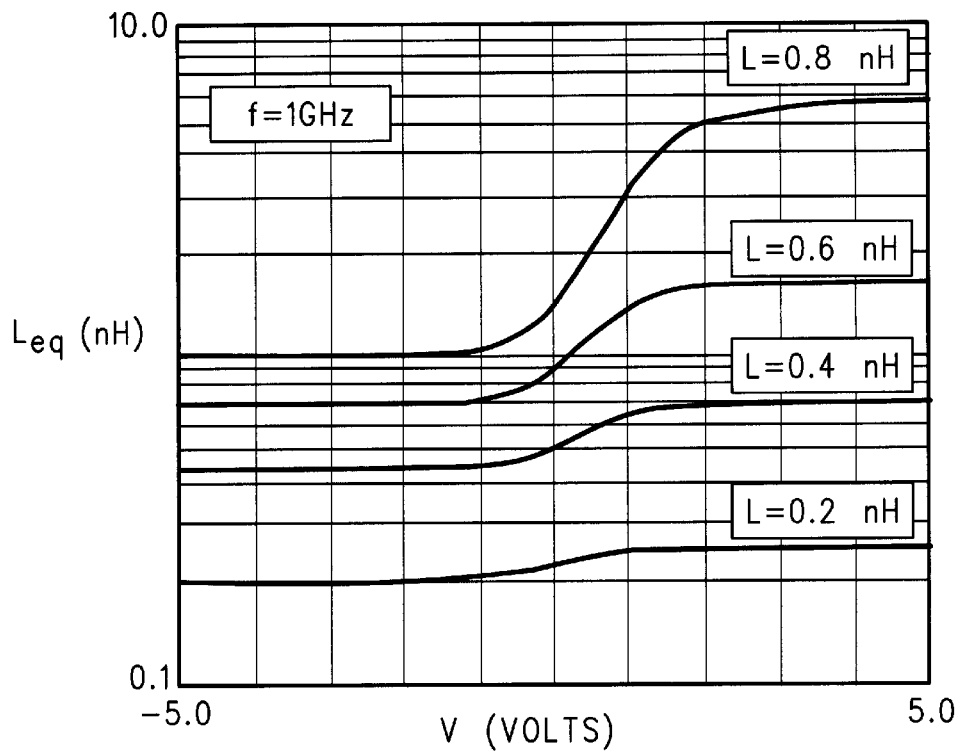
FIG. 4 shows tuning ranges of a tunable inductor circuit as shown in FIG. 1 For various values of the inductance L.

FIGS. 1 and 2 show two embodiments of a tunable inductor circuit according to the present invention. The tunable inductor circuit includes an inductor and a voltage variable capacitor connected to each other. The voltage variable capacitor 7 provides a range of different capacitance values as a function of a control voltage signal V. FIG. 3 gives a typical C vs. V response of the voltage variable capacitor 7. In FIG. 1, a tunable inductor circuit 1 has an inductor 5 and a voltage variable capacitor 7 connected to each other in parallel. The combined impedance of the tunable inductor circuit 1 can be made to an equivalent inductance, Leq, of a single inductor according to the following relation:

$$\text{Leq} = L/(1 - \omega^2 LC), \qquad (1)$$

where L is the inductance of inductor 5, C is the capacitance of voltage variable capacitor 7 and $\omega(=2\pi f)$ is the angular frequency of a signal passing through the tunable inductor circuit 1. FIG. 4 gives the tuning ranges of this equivalent inductance Leq as a function of a control voltage signal V for various values of the inductance L at a frequency of f=1 GHz. As can be seen in FIG. 4, the tuning range for Leq of the tunable inductor circuit 1 for the given frequency is most leveraged at L=0.93 nH.

Figure 5:
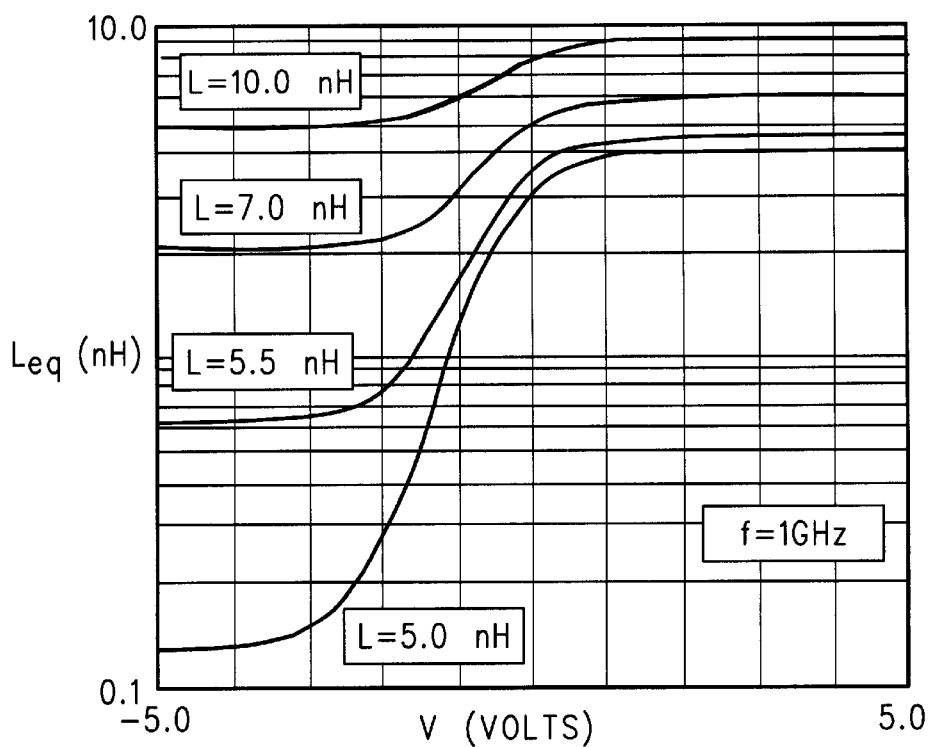
FIG. 5 shows tuning ranges of a tunable inductor circuit as shown in FIG. 2 for various values of the inductance L.

In FIG. 2, a tunable inductor circuit 3 has an inductor 5 and a voltage variable capacitor 7 connected to each other in series. The voltage variable capacitor 7 has tuning characteristic range as shown in FIG. 3. The combined impedance of the tunable inductor circuit 3 can be made to an equivalent inductance, Leq, of a single inductor according to the following relation:

$$Leq=(\omega^2 LC-1)/(\omega^2 C), \qquad (2)$$

where L is the inductance of inductor 5, C is the capacitance of voltage variable capacitor 7 and $\omega(=2\pi f)$ is the angular frequency of a signal passing through the tunable inductor circuit 3. FIG. 5 gives the tuning ranges of this equivalent inductance Leq as a function of a control voltage signal V for various values of the inductance L at a frequency of f=1 GHz. As can be seen in FIG. 5, the tuning range for Leq of the tunable inductor circuit 3 for the given frequency is most leveraged at L=4.87 nH. Thus, the tuning ranges for Leq for the first embodiment of the tunable inductor circuit 1 as shown in FIG. 1 and for the second embodiment of the tunable inductor circuit 3 as shown in FIG. 2 are complimentary to each other, which can be utilized to provide a wide variety of RF/microwave tuning circuits resulting in many applications.

Phase Tuning Circuits

FIGS. 6–11 show various phase tuning circuits utilizing at least one tunable inductor circuit 9 according to the present invention. It will be appreciated that in the following description, the tunable inductor circuit 9 is a tunable inductor circuit may be in the form shown in FIG. 1 or FIG. 2, unless otherwise specified.

Figure 6:
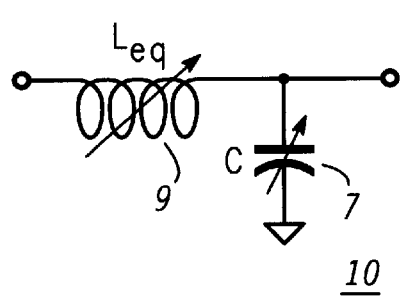
FIG. 6 is a first embodiment of a representative phase tuning circuit according to the present invention.
Figure 7:
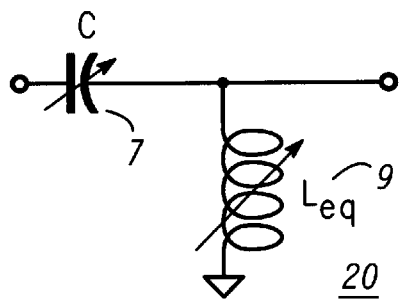
FIG. 7 is a second embodiment of a representative phase tuning circuit according to the present invention.

Referring now to FIG. 6, a phase tuning circuit 10 has a voltage variable capacitor 7 and a tunable inductor circuit 9. The voltage variable capacitor 7 is connected to the tunable inductor circuit 9 at one terminal and to ground at another terminal. Likewise, FIG. 7 shows a phase tuning circuit 20 having a voltage variable capacitor 7 and a tunable inductor circuit 9. In the embodiment shown in FIG. 7, however, the tunable inductor circuit 9 is connected to the voltage variable capacitor 7 at one terminal and to ground at another terminal. Thus, the tuning characteristic of the phase tuning circuit 10 is different from the tuning characteristic of the phase tuning circuit 20. Both the phase tuning circuit 10 and the phase tuning circuit 20 can be considered as a two-element phase tuning network because each circuit has a tunable inductor circuit and a voltage variable capacitor.

Figure 8:
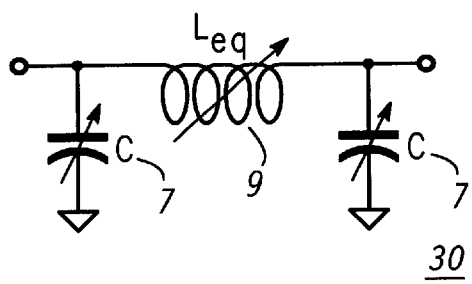
FIG. 8 is a third embodiment of a representative phase tuning circuit according to the present invention.
Figure 9:
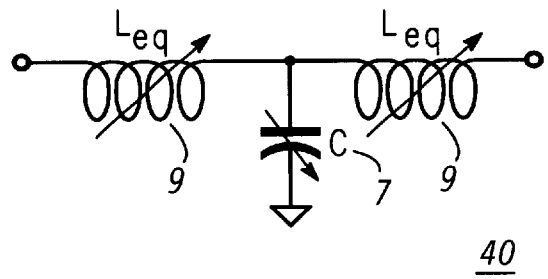
FIG. 9 is a fourth embodiment of a representative phase tuning circuit according to the present invention.

FIGS. 8 and 9 each shows a three-element phase network according to the present invention. In FIG. 8, a phase tuning circuit 30 has two voltage variable capacitors 7 and one tunable inductor circuit 9. In the embodiment shown in FIG. 8, each of the voltage variable capacitor 7 is connected to the tunable inductor circuit 9 at one terminal and to ground at another terminal. Moreover, each voltage variable capacitor 7 is connected to a different terminal of the tunable inductor circuit 9. In contrast, in FIG. 9, a phase tuning circuit 40 has one voltage variable capacitor 7 and two tunable inductor circuits 9. In the embodiment shown in FIG. 9, each voltage variable capacitor 7 is connected to the tunable inductor circuit 9 at one terminal and to ground at another terminal. Thus, the tuning characteristic of the phase tuning circuit 30 is different from the tuning characteristic of the phase tuning circuit 40.

Figure 10:
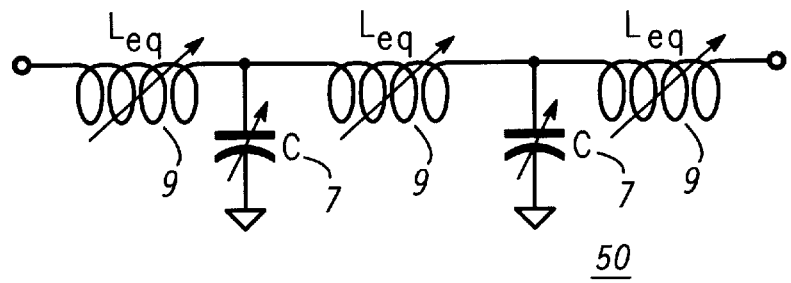
FIG. 10 is a fifth embodiment of a representative phase tuning circuit according to the present invention.
Figure 11:
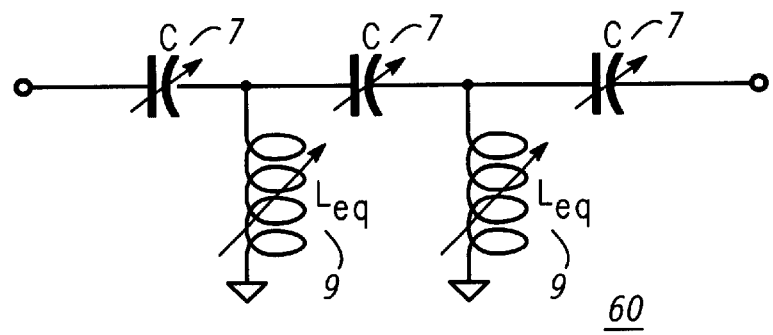
FIG. 11 is a sixth embodiment of a representative phase tuning circuit according to the present invention.

FIGS. 10 and 11 each shows a five-element phase network according to the present invention. In FIG. 10, a phase tuning circuit 50 has two voltage variable capacitors 7 and three tunable inductor circuits 9, and can be also described as a lumped transmission line. In the embodiment shown in FIG. 10, three tunable inductor circuits 9 are connected in series. Thus, a node is formed between each two adjacent tunable inductor circuits 9. Each of the two voltage variable capacitors 7 is connected to a node at one terminal and to ground at another terminal. In contrast, in FIG. 11, a phase tuning circuit 60 has three voltage variable capacitors 7 and two tunable inductor circuits 9. In this embodiment, the three voltage variable capacitors 7 are connected in series. Thus, a node is formed between each two adjacent voltage variable capacitors 7. Each of the two tunable inductor circuits 9 is connected to a node at one terminal and to ground at another terminal. Thus, the tuning characteristic of the phase tuning circuit 50 is different from the tuning characteristic of the phase tuning circuit 60.

In general, an N-component phase tuning circuit (not shown) can be formed according to the present invention, where N is an integer greater than four. In one embodiment, the phase tuning circuit has M tunable inductor circuits 9 connected in series and M−1 voltage variable capacitors 7 coupled to the M tunable inductor circuits 9, where M and N satisfy the following condition: M=[(N+1)/2], wherein [X] means to take the integer part of variable X. In this embodiment, each voltage variable capacitor 7 is connected to a node between adjacent tunable inductor circuits 9 and to ground. In another embodiment (not shown), the phase tuning circuit has M voltage variable capacitors 7 connected in series and M−1 tunable inductor circuits 9 coupled to the M voltage variable capacitors 7, where M and N satisfy the following condition: M=[(N+1)/2]. In this embodiment, each tunable inductor circuit 9 is connected to a node between two adjacent voltage variable capacitors 7 and to ground.

Various embodiments of the phase tuning circuits as shown in FIGS. 6–11 and/or discussed above can be utilized, alone, in balanced differential configuration, or in combination, in various RF and microwave circuits and related applications to provide dynamic phase control. The following applications are several representative examples.

Applications of Tunable Inductor Circuits and Phase Tuning Circuits

A Lumped Transmission Line

Figure 12:
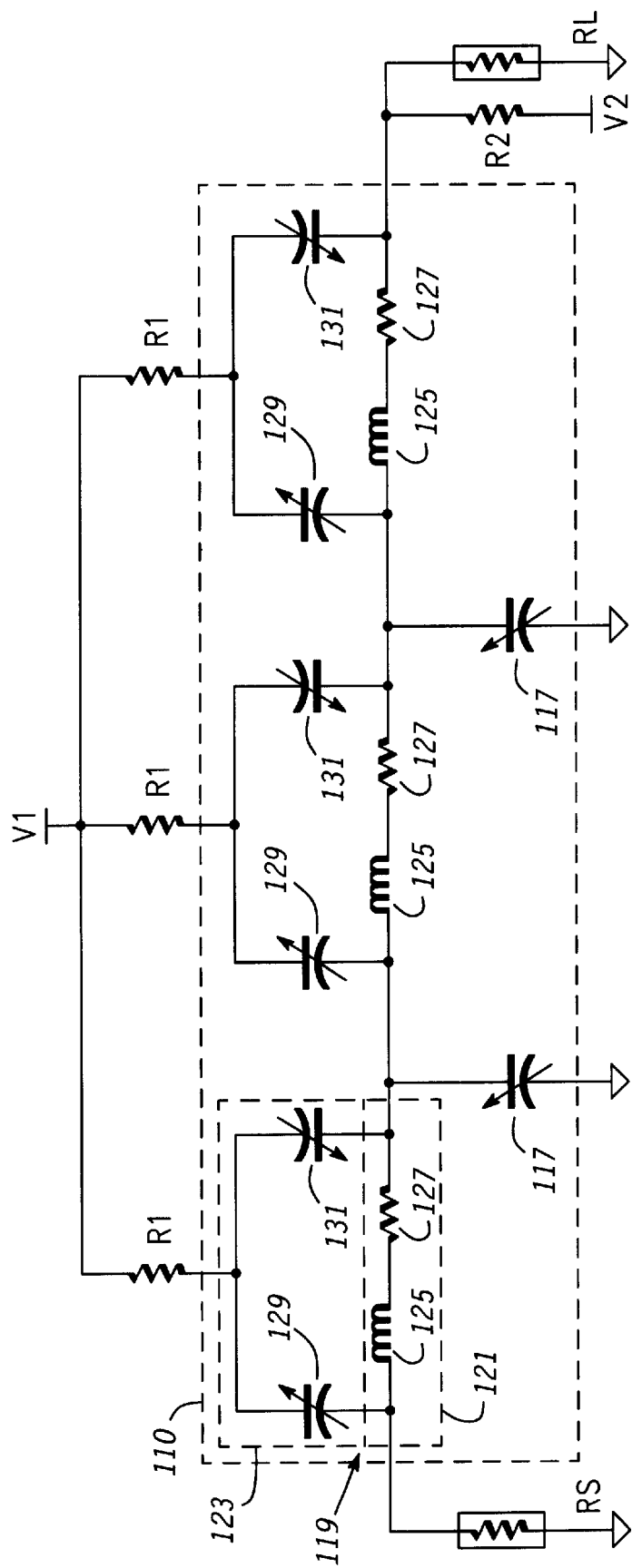
FIG. 12 is a representative lumped transmission line featuring tunable inductor circuits according to the present invention.

FIG. 12 shows a lumped transmission line 100 having a phase tuning circuit 110 and two control signals, V1 and V2. The lumped transmission line 100 couples a signal from a source having a source resistance, $R_S$, and essentially no source reactance, to a fixed load resistance, $R_L$, and essentially no load reactance. Phase tuning circuit 110 has a voltage variable capacitors 117 and a tunable inductor circuits 119 wherein the voltage variable capacitor 117 is coupled to its associated tunable inductor circuit 119 at one terminal and to ground at another terminal. Each tunable inductor circuit 119 includes a first network 121 and a second network 123. For the embodiment shown in FIG. 12, the first network 121 is modeled by an inductance 125 and a resistance 127 that is connected to the inductance 125 in series. Resistance 127 represents internal losses of a physical inductor having the inductive reactance represented by inductance 125. The second network 123 includes two voltage variable capacitors 129, 131 connected to each other in series. Preferably, two voltage variable capacitors 129, 131 are substantially the same in terms of their capacitance versus voltage characteristics. The first network 121 and the second network 123 are connected to each other in parallel. The control signal V1 is coupled through a plurality of resistors R1 on a one for one basis to the plurality of network 123, and the control signal V2 is coupled through a single resistor R2 and through the series connected network 121 to the voltage variable capacitors 117 (the internal resistances 127 are substantially smaller than $R_L$ and $R_S$, so that essentially the same voltage appears at the voltage variable capacitors 117.

The lumped transmission line 100 as shown in FIG. 12 can be used as a lumped transmission line 50 (FIG. 10). One advantage of the lumped transmission line 50, 100 is that, in accordance with a preferred embodiment of the present invention, it is tuned to provide a varying transfer phase shift while keeping the characteristic input impedance, $Z_0$ constant by using the relationship shown in equation 3:

$$Z_0 = \sqrt{Leq/C}, \quad (3)$$

in which Leq is the equivalent inductance 9 in FIG. 10 and the equivalent inductance of the tunable inductor circuit 119 in FIG. 12, and C is the shunt voltage variable capacitance 7 in FIG. 10 and the voltage variable capacitors 117 in FIG. 12. When only the shunt capacitance values of the voltage variable capacitors 7 (FIG. 10), 117 (FIG. 12) are tuned, the characteristic impedance of the line and the transfer phase shift are both changed. That is to say, a constant characteristic impedance with a variable transfer phase shift $S_{21}$, where $S_{21}$ is the phase difference of the signal across the lumped transmission length, cannot be realized by tuning the shunt capacitance only. To provide a constant characteristic impedance with a variable transfer phase shift $S_{21}$, both the shunt capacitance (117 in FIG. 12, 7 in FIG. 10) and the series inductance (119 in FIG. 12, 9 in FIG. 10) must be tuned properly in co-ordination with each other. In accordance with the preferred embodiment of the present invention FIG. 12, control signals V1 and V2 are coordinated to maintain a constant ratio of Leq/C while the product of Leq*C is varied in order to present a varying transfer phase $S_{21}$. The varying transfer phase $S_{21}$, also referred to as the delay of the input signal across the lumped transmission 100, is a function of the product Leq*C. In this way, the lumped transmission line 100 can be used as a transmission line with a substantially constant characteristic impedance. The determination of the variance of Leq is accomplished by conventional computer modeling of the network 119, or alternatively by measuring a representative set of networks 119. This embodiment is useful, for example, in a power splitter combiner component to compensate for phase imbalance across the independent split or combined signal paths, while maintaining matched termination impedance.

In accordance with an alternative embodiment of the present invention, the control signals V1 and V2 are coordinated to vary Leq 9 and C 7 (FIG. 10) (which are equivalent to the equivalent inductance of tunable inductance circuit 119 of FIG. 12 and capacitance 117 of FIG. 12) to vary the characteristic impedance of the lumped transmission line as a resistive only impedance while maintaining a substantially constant transfer phase $S_{21}$. This embodiment is useful for changing the characteristic impedance to match a changing source impedance, $R_S$, for example, in a power amplifier circuit as a variable load impedance to improve DC to RF conversion efficiency at different output signal levels.

This alternative embodiment is described with reference to FIGS. 10 and 12 wherein $R_S$ is a variable real only source impedance and $R_L$ is a fixed real only load impedance on lumped transmission line 100 and for which a fixed 90 degree transfer phase shift is maintained when $R_S$ is varied. The phase shift of 90 degrees is maintained with the following relationships, in which the capacitance C represents C 7 (FIG. 10) or capacitors 117 (FIG. 12) and Leq is Leq 9 (FIG. 10) or the inductance of tunable inductance 119 (FIG. 12):

$$C = (\sqrt{3 - \sqrt{5}})/(\sqrt{2 \cdot R_S \cdot R_L} \cdot w) \quad (5)$$

$$Leq = R_S \cdot R_L \cdot C \quad (6)$$

$$w = 2 \cdot Pi \cdot Frequency \quad (7)$$

$$Z_0 = \sqrt{R_S \cdot R_L} \quad (8)$$

Equation 6 shows the required relation between $R_S$, the source impedance, and the ratio of Leq/C. The termination impedance, Zo, of the network 100 and $R_L$, has only a real (resistive) component when the product of Leq*C is held constant (i.e., the transfer phase shift is held constant) as the (real) value of Zo is varied.

Dynamic Quadrature Signal Generator

A quadrature generator is a device that receives an input signal and generates two output signals having a 90° phase angle between them. Due to the sensitivity of analog circuit parameters, it is difficult, if not impossible, to produce and maintain a substantially constant quadrature phase angle.

Figure 13:
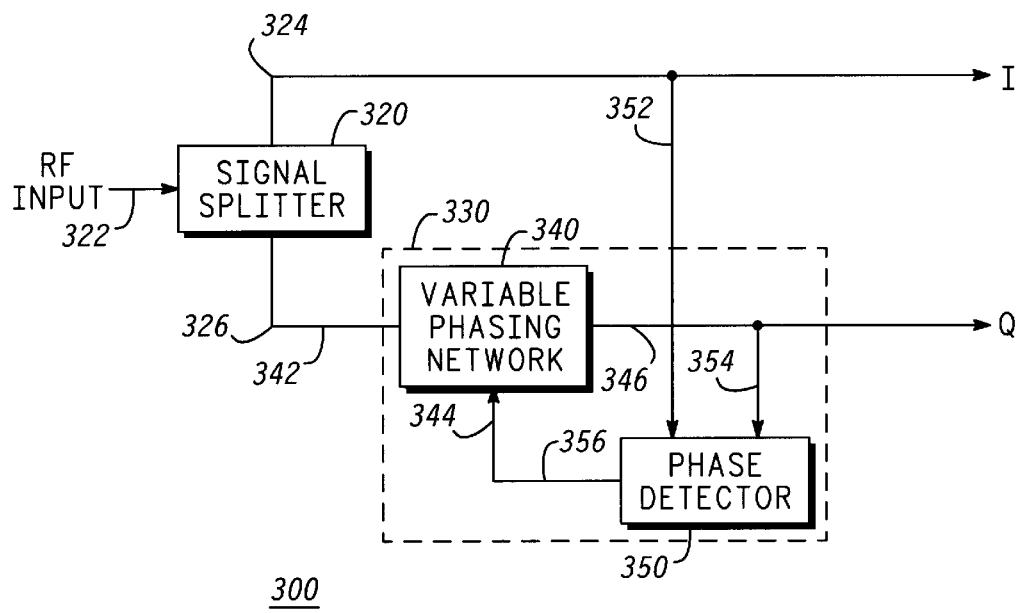
FIG. 13 shows a dynamic quadrature generator according to the present invention.

Referring now to FIG. 13, a dynamic quadrature generator 300 according to the present invention is shown. The quadrature generator 300 has a signal splitter 320 and a phase-delay lock loop 330. The signal splitter 320 has an input 322 and two outputs 324, 326. The signal splitter 320 is adapted to receive an RF signal as input at input 322 and generates first and second signal components at the outputs 324, 326 respectively. There is no phase difference between the first and second signal components at the outputs 324, 326.

The phase-delay lock loop 330 includes a variable phasing network 340 and a phase detector 350. The variable phasing network 340 has first and second inputs 342, 344 and an output 346. The first input 342 of the variable phasing network 340 is coupled to the output 326 of the phase splitter 320 to receive the second signal component. The variable phasing network 340 is capable of generating a phase delay in the second signal component with respect to the first signal component. The phase detector 350 has two inputs 352, 354 and one output 356. One input of the phase detector 350, such as input 352, is coupled to the first signal component and the other input of the phase detector 350, such as input 354, is coupled to output 346 of the variable phasing network 340.

In operation, the variable phasing network 340 receives the second signal component from the signal splitter 320 and generates a phase delay in the second signal component. The phase detector 350 detects a phase difference between the first signal component and a signal at the output 346 of the variable phasing network 340 and generates a control voltage based on the phase difference at the output 356 of the phase detector 350. The output 356 of the phase detector 350 is coupled to the second input 344 of the variable phasing network 340. Upon receiving the control voltage from the output 356 of the phase detector 350, the variable phasing network 340 changes the phase of the second signal component to dynamically maintain a desired phase difference between the output first signal component (I) and second signal component (Q). For quadrature generator 300, this phase difference is 90°. Any small deviation of the quadrature signals from the desired 90° will be quickly corrected by the phase-delay lock loop 330.

The variable phasing network 340 includes at least one of the phase tuning circuits of the present invention (several examples of which are shown in FIGS. 6–11). In one embodiment, the variable phasing network 340 includes a phase tuning circuit as shown in FIG. 10 and described in detail above. In another embodiment (not shown), the variable phasing network 340 includes a phase tuning circuit as shown in FIG. 11. In general, it will be appreciated that the variable phasing network 340 includes a plurality of tunable inductor circuits connected in series and a plurality of voltage variable capacitors coupled to the tunable inductor circuits. Specifically, each voltage variable capacitor is connected to a node between adjacent tunable inductor circuits and ground. Each tunable inductor circuit is a tunable inductor circuit in the form shown in FIGS. 1 or 2.

Dynamic Doherty Power Amplifier

A further application of the tunable inductor circuits and phase tuning circuits of the present invention is in a dynamic Doherty power amplifier.

Figure 14:
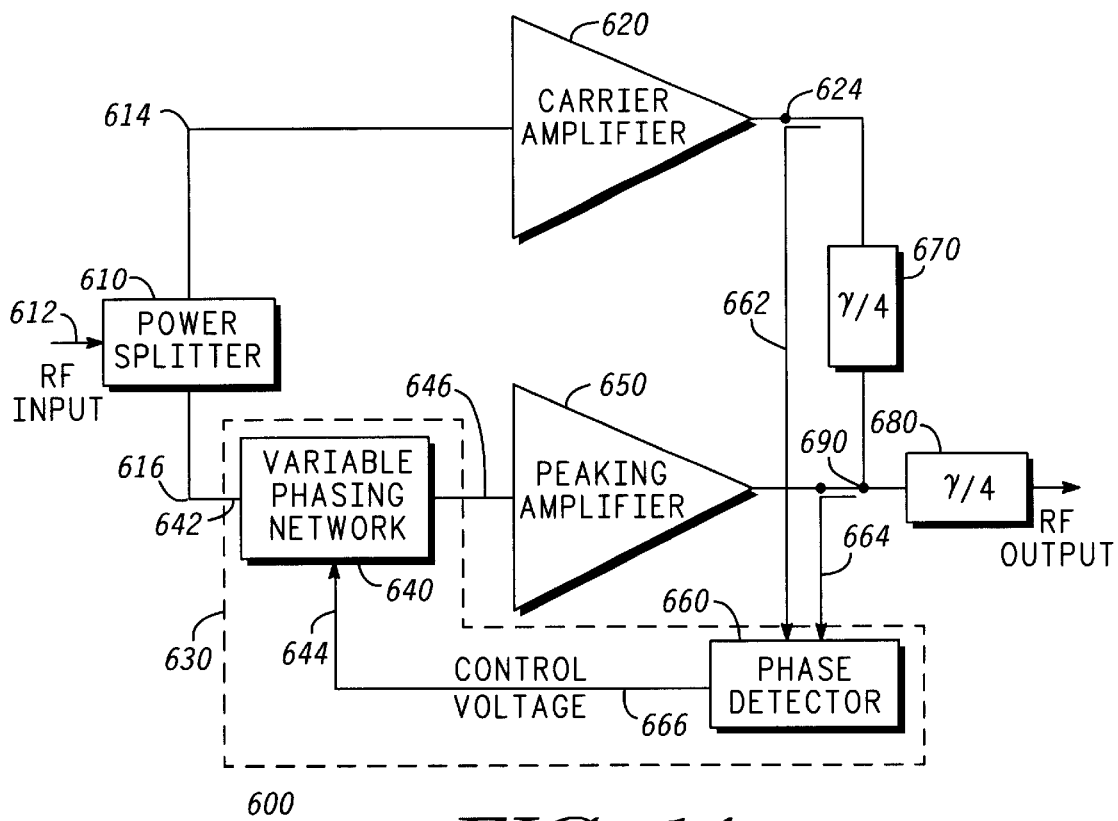
FIG. 14 shows a dynamic Doherty power amplifier according to the present invention.

FIG. 14 shows a Doherty power amplifier 600 according to the present invention. The Doherty power amplifier 600 has a power or signal splitter 610, a phase-delay lock loop 630, a first amplifier 620, a second amplifier 650 and quarter wave transformers 670, 680. While the embodiment shown in FIG. 14 identifies the first amplifier 620 as a carrier amplifier and the second amplifier 650 as a peaking amplifier, it will be appreciated that any type of power amplifiers known in the art can be substituted therein.

The signal splitter 610 has input 612 and two outputs 614, 616. The signal splitter 610 is adapted to receive an RF signal as input at input 612 and generates first and second signal components at the outputs 614, 616 respectively. The first signal component at the output 614 is received as input by the first amplifier 620, and the second signal component at the output 616 is received as input by the phase-delay lock loop 630. The first amplifier 620 amplifies the first signal component and generates an output signal at output 624.

The phase-delay lock loop 630 includes a variable phasing network 640 and a phase detector 660. The variable phasing network 640 has a first and second inputs 642, 644 and an output 646. The first input 642 of the variable phasing network 640 is coupled to the output 616 of the power splitter 610 to receive the second signal component. The variable phasing network 640 is capable of generating a phase delay in its output signal with respect to the first signal component. The second amplifier 650 is coupled to the output 646 of the variable phasing network 640 to amplify an output signal of the variable phasing network 640 and generate an output signal.

The phase detector 660 has two inputs 662, 664 and one output 666. The phase detector 660 is coupled to the outputs of the first amplifier 620 and second amplifier 650 through inputs 662, 664, respectively, to detect a phase difference therebetween and generate a control voltage based on the phase difference at the output 666 of the phase detector 660 that is coupled to the input 644 of the variable phasing network 640.

Upon receiving the control voltage from the output 666 of the phase detector 660, the variable phasing network 640 changes the phase of the second signal component to dynamically maintain a desired phase difference between the output signal of the first amplifier 620 and the output signal of the second amplifier 650. Any small deviation from the desired phase difference, such as 90°, will be quickly corrected by the phase-delay lock loop 630. The amplified output signals with desired phase difference from the first and second amplifiers 620, 650 are then combined at node 690 to produce an RF output through quarter wave transformer 680.

The variable phasing network 640 is substantially the same as the variable phasing network 340 discussed above. That is to say, the variable phasing network 640 includes at least one of the phase tuning circuits of the present invention (several examples of which are shown in FIGS. 6–11). In one embodiment, the variable phasing network 640 includes a phase tuning circuit as shown in FIG. 10. In another embodiment (not shown), the variable phasing network 640 includes a phase tuning circuit as shown in FIG. 11. In general, it will be appreciated that the variable phasing network 640 includes a plurality of tunable inductor circuits connected in series and a plurality of voltage variable capacitors coupled to the tunable inductor circuits.

In sum, the present invention relates to a tunable inductor and a phase tuning circuit having at least one tunable inductor circuit and at least one voltage variable capacitor coupled to the at least one tunable inductor circuit, wherein the at least one tunable inductor circuit and the voltage variable capacitor are responsive to control signals to alter a tuning characteristic of the phase tuning circuit. The tunable inductor circuit has an inductor and a voltage variable capacitor connected to each other. The inductor and the voltage variable capacitor can be connected to each other in parallel or in series.

Additionally, the present invention provides a lumped transmission line including a plurality of phase tuning circuits according to the present invention coupled in series, wherein the voltage variable capacitor in each phase tuning circuit is coupled to its associated tunable inductor circuit at one terminal and to ground at another terminal. Moreover, each tunable inductor circuit has a first network including an inductor and a parasitic resistor connected to the inductor in series and a second network including two voltage variable capacitors connected to each other in series. The first network is connected in parallel with the second network.

Furthermore, the present invention relates to an apparatus for adjusting the phase of a signal having first and second signal components. The apparatus includes a variable phasing network having an input and an output, the input of the variable phasing network being coupled to the second signal component, and a phase detector having two inputs and one output, wherein one input of the phase detector is coupled to the first signal component and the other input is coupled to the output of the variable phasing network. In operation, the phase detector detects a phase difference between the first signal component and a signal at the output of the variable phasing network and generates a control voltage based on the phase difference at the output of the phase detector that is coupled to the input of the variable phasing network, wherein the variable phasing network receives the control voltage from the output of the phase detector and changes the phase of the second signal component.

Moreover, the present invention relates to an amplifier having a variable phasing network and a signal splitter. The signal splitter has an input and a first and second outputs, the signal splitter being adapted to receive as input a radio frequency (RF) signal and generate first and second signal components at the first and second outputs, respectively, the input of the variable phasing network being coupled to the second output of the signal splitter. A first amplifier is connected to the first output of the signal splitter, the first amplifier amplifying the first signal component and generating an output signal at an output. A second amplifier is coupled to the output of the variable phasing network, the second amplifier amplifying an output signal of the variable phasing network and generating an output signal. A phase detector is coupled to the outputs of the first and second amplifiers and detects a phase difference therebetween and generates a control voltage based on the phase difference at the output of the phase detector that is coupled to the input of the variable phasing network.

While there has been shown a preferred and alternate embodiments of the present invention, it is to be understood that certain changes may be made in the forms and arrangements of the components and steps of the inventive method without departing from the spirit and scope of the invention as set forth in the claims appended herewith.

What is claimed is:

1. A lumped transmission line comprising:
    a phase tuning circuit having a transfer phase shift characteristic and an impedance characteristic, the phase tuning circuit comprising:
        at least one tunable inductor circuit having an inductor and a voltage variable capacitor connected to each other in one of a series or a parallel arrangement;
        at least one voltage variable capacitor coupled to the at least one tunable inductor circuit; and
        a control signal source that provides first and second control signals to the phase tuning circuit that are coordinated in a manner that maintains as an essentially constant value the transfer phase shift characteristic while varying the impedance characteristic, or that maintains as an essentially constant value the impedance characteristic while varying the transfer phase shift characteristic.

2. The phase tuning circuit of claim 1, wherein the at least one tunable inductor circuit is connected to the at least one voltage variable capacitor at one terminal and to ground at another terminal.

3. The phase tuning circuit of claim 1, wherein the at least one voltage variable capacitor is connected to the at least one tunable inductor circuit at one terminal and to ground at another terminal.

4. The phase tuning circuit of claim 1, wherein the at least one tunable inductor circuit comprises a plurality of tunable inductor circuits connected in series; and
    wherein the at least one voltage variable capacitor comprises a plurality of voltage variable capacitors, each voltage variable capacitor being connected to a node between adjacent tunable inductor circuits and to ground.

5. The phase tuning circuit of claim 1, wherein the at least one voltage variable capacitor comprises a plurality of voltage variable capacitors connected in series; and
    wherein the at least one tunable inductor circuit comprises a plurality of tunable inductor circuits, each tunable inductor circuit being connected to a node between adjacent voltage variable capacitors and to ground.

6. The lumped transmission line of claim 1, further comprising a plurality of phase tuning circuits coupled in series, wherein the voltage variable capacitor in each phase tuning circuit is coupled to an associated tunable inductor circuit at one terminal and to ground at another terminal.

7. The lumped transmission line of claim 6, wherein the tunable inductor circuit comprises:
    a first network comprising an inductor; and
    a second network comprising two voltage variable capacitors connected to each other in series;
    wherein the first network is connected in parallel with the second network.

8. An amplifier, comprising:
    an apparatus for adjusting the phase difference of a signal having first and second signal components, comprising:
        a variable phasing network having first and second inputs and an output, the first input of the variable phasing network being coupled to the second signal component; and
        a phase detector having two inputs and one output, wherein one input of the phase detector is coupled to the first signal component and the other input is coupled to the output of the variable phasing network, wherein the phase detector detects a phase difference between the first signal component and a signal at the output of the variable phasing network and generating a control voltage based on the phase difference at the output of the phase detector that is coupled to the second input of the variable phasing network, wherein the variable phasing network receives the control voltage from the output of the phase detector and changes the phase of the second signal component;
        a signal splitter having an input and first and second outputs, the signal splitter being adapted to receive as input a radio frequency (RF) signal and generate first and second signal components at the first and second outputs respectively, the input of the variable phasing network being coupled to the second output of the signal splitter;
        a first amplifier connected to the first output of the signal splitter, the first amplifier amplifying the first signal component and generating an output signal at an output; and
        a second amplifier coupled to the output of the variable phasing network, the second amplifier amplifying an output signal of the variable phasing network and generating an output signal;
    wherein the phase detector is coupled to the outputs of the first and second amplifiers and detects a phase difference therebetween and generates a control voltage based thereon that is coupled to the input of the variable phasing network.

9. The amplifier of claim 8, wherein the variable phasing network comprises:
    a plurality of tunable inductor circuits connected in series; and
    a plurality of voltage variable capacitors, wherein each voltage variable capacitor is connected to a node between so as connected tunable inductor circuits and to ground.

10. The amplifier of claim 9, wherein each tunable inductor circuit comprises an inductor and a voltage variable capacitor connected to each other in one of a series and a parallel arrangement.

11. The amplifier of claim 8, wherein the signal splitter splits the RF signal into the first signal component comprising a carrier component of the RF signal and the second signal component comprising peak components of the RF signal, wherein the first amplifier amplifies the carrier component and the second amplifier amplifies the peak components.

12. The amplifier of claim 9, wherein the first amplifier is a carrier amplifier.

13. The amplifier of claim 9, wherein the second amplifier is a peaking amplifier.

* * * * *